United States Patent [19]

Mallott

[11] Patent Number: 4,746,765
[45] Date of Patent: * May 24, 1988

[54] COPLANAR RF DOOR SEAL

[76] Inventor: Orville B. Mallott, 30430 8th SW., Federal Way, Wash. 98003

[*] Notice: The portion of the term of this patent subsequent to Apr. 7, 2004 has been disclaimed.

[21] Appl. No.: 946,766

[22] Filed: Dec. 29, 1986

Related U.S. Application Data

[63] Continuation-in-part of Ser. No. 626,331, Jun. 29, 1984, Pat. No. 4,656,312.

[51] Int. Cl.$^4$ .............................................. H05K 9/00
[52] U.S. Cl. .................. 174/35 GC; 49/477; 174/35 MS
[58] Field of Search .............. 174/35 MS, 35 GC; 219/10.55 D; 52/173 DS, 656; 49/477, 485

[56] References Cited

U.S. PATENT DOCUMENTS

| | | | |
|---|---|---|---|
| 2,757,225 | 7/1956 | Dunn | 174/35 MS |
| 2,853,541 | 9/1958 | Lindgren | 174/35 MS |
| 3,055,969 | 9/1962 | Schaller, Jr. | 174/35 MS |
| 3,134,020 | 5/1964 | Shoenfeld | 174/35 MS |
| 3,504,095 | 3/1970 | Roberson et al. | 174/35 GC |
| 3,507,974 | 4/1970 | Clark et al. | 174/35 MS |
| 4,656,312 | 4/1987 | Mallott | 174/35 GC |

Primary Examiner—R. L. Moses
Assistant Examiner—David A. Tone
Attorney, Agent, or Firm—Mark Zovko

[57] ABSTRACT

A door seal for a room shielded against electromagnetic radiation in which the door leaf is mounted on a door frame and will move between open and closed positions. The door seal is formed of coplanar layered flexible metal sheets. A layer of coplanar seal sheets is attached to the door leaf and arranged end to end around the periphery of the door leaf. A subsequent layer or layers or coplanar sheets are also attached to the door and so arranged over the adjacent layer to cover its seams. The layered sheets on the door leaf are pressed into full contact with the door frame by a conventional seal such as a tubular bladder. Alternatively, the layers of co-planar sheets may be attached to the door frame and sealed against the door leaf. The layered sheets are flame sprayed to protect against corrosion and assure a highly conductive surface between layers.

4 Claims, 3 Drawing Sheets

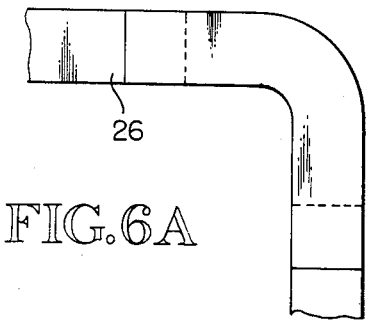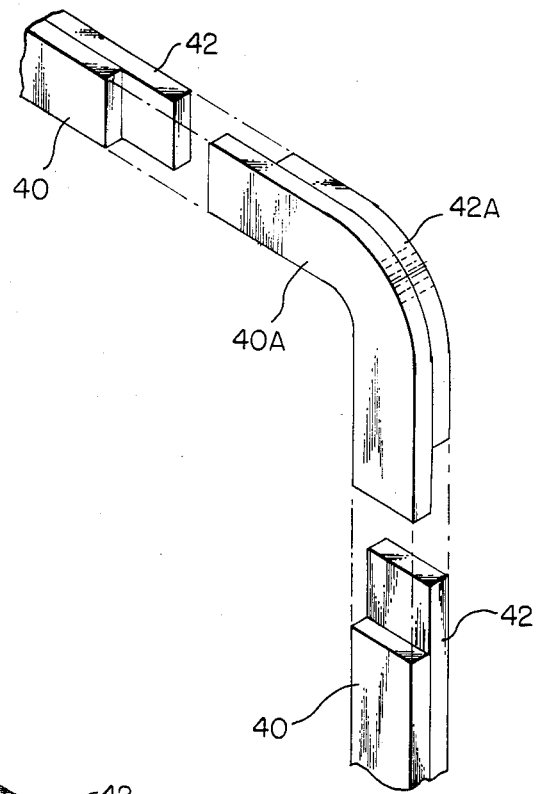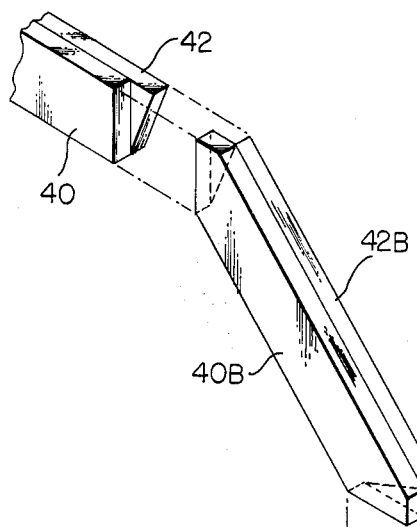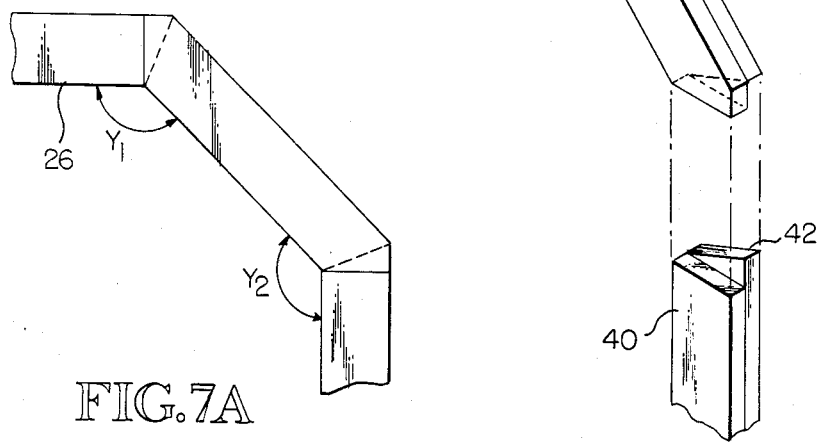

COPLANAR RF DOOR SEAL

CROSS RELATION TO OTHER APPLICATIONS

This invention is a continuation in part of Ser. No. 626,331, co-pending and filed 6/24/84 now issued as U.S. Pat. No. 4,656,312.

BACKGROUND OF THE INVENTION

1. Field of the Invention

This invention relates in general to radio frequency (RF) shielding for a room and more particularly to coplanar RF door seal utilizing layered flexible metal sheets.

2. Discussion of the Prior Art

It is sometimes necessary to provide a room of relatively large size which is shielded against electromagnetic radiation. Such shielded rooms are used, for example, for circuit testing for RF emission tests, for housing certain computer installations, etc.

A shielded room of the type to which the present invention is directed is a specially made enclosure and is of sufficient size to permit workmen to conduct various work operations therein. The enclosure must be provided with an opening of sufficient size to permit passage of workmen and equipment therethrough. A primary problem with construction of a shielded enclosure is to provide a door which will completely seal the opening against electromagnetic radiation.

The shielded room and door must be constructed of a metal which will afford substantial protection against electromagnetic radiation. In the prior art there have been serious problems associated with the design and construction of shielded doors. The seals have not been effective because of gaps between the seal and the door. The reliability of the seals is poor due to fragile construction and thus will not stand extended usage without frequent repair.

Early prior art shielded doors are usually held against a wall of the shielded enclosure by a latch. In actual practice, the engaging surfaces of the door and wall are not perfectly flat. Thus, to the extent that the surfaces are not completely flat and coplanar, gaps between the surfaces are created. In an effort to overcome this problem, the engaging surfaces of the door and enclosure are meticulously machined at considerable expense. The door must then be very accurately mounted on the wall to assure proper engagement of the surfaces in the closed position of the door. Notwithstanding these expensive and tedious work operations, prior art constructions have proved unsatisfactory in that the latch may hold a local region of the door tightly against the wall, but it does little to assure that the entire periphery of the door will be tightly sealed to the wall surface.

Another attempt to effect a workable seal has been to use integral expander tubes. The prior art doors utilizing these integral expander tubes have been heavy, costly, complex, and subject to considerable maintenance. These doors have been inordinately thick so as to cause excessive vehicular and person traffic problems caused by the inherently large gap in which the door slides. Where the doors are supplied with integral expander tubes, they also must be supplied with compressed air lines to the door and thus require the moving of the air hoses along therewith. The weight of the heavy doors causes considerable difficulty in manual operation that results in safety hazards.

More recently (as in U.S. Pat. No. 4,370,831 issued to Hamilton), an RF shielded door seal has been formed of peripheral flexible plates that are welded together on their outer edges. Spaced between the plates and between the frame and the door, a peripheral tubular bladder is located. The bladder, when expanded with compressed air, forces the plates outwardly against the door and the frame to form a seal. Problems of leakage, however, still persist in this construction due to irregularities in the flexible plates created during the welding process. RF radiation can leak through these small deformities caused by welding the plates together and it would be desirable to have a seal which prevented this problem.

SUMMARY OF THE INVENTION

The present invention eliminates the foresaid problems and improves upon the present art by providing a seal which includes coplanar layered flexible sheets. More specifically, the present invention is used with a door and frame assembly for a room shielded against leakage of RF radiation. The door and frame assembly includes a door leaf and door frame on which the door leaf is mounted. The door frame will have a seal nesting surface which opposes and is spaced outwardly from the border of the door all the way around the door. A first series of flexible metal plates is provided which consists of individual metal sheets arranged end to end. This first series or layer of sheets is fixedly attached to the door and extends beyond the borders of the door all the way around the door. The first layer of flexible metal sheets is closest to the door frame and capable of aligning with the seal nesting surface of the door frame when the door is closed. A second series or layer of flexible metal sheets is also provided. The second layer of flexible metal sheets is adjacent to and contacts the first layer, also being fixed to the door. The second layer of flexible metal sheets is so arranged in an end-to-end fashion as to overlap the seams made by the first layer of flexible metal sheets. This overlap minimizes RF leakage when the door is closed as compared to using a single layer of sheets which are welded at the end-to-end joints. In the seal of the present invention, prior art means such as a tubular bladder can be used to hold the flexible metal sheets in contact with the door frame when the door is closed. Alternatively to the above, the layers of flexible metal sheets may be attached to the door frame instead of the door itself and the door can be provided with a seal nesting surface. The important factor is that the first and second layer of sheets are between the door and door frame when the door is in a closed position. The present invention also contemplates flame-spraying of the layers of sheets to create a highly conductive and corrosion resistant surface.

Accordingly, it is an object of the present invention to provide an improved RF door seal, minimizing RF leakage from a containment.

Another object of the present invention is to allow high level containment of RF and magnetic energy by using layered flame sprayed metal sheets.

A further object of the present invention is to provide a RF door seal utilizing flexible metal sheets which makes it unnecessary to weld the sheets together.

A still further object of the present invention is to provide a RF door seal which can readily be replaced if damaged.

Yet another object of the present invention is to provide a RF door seal in which thinner, more flexible metal sheets may be used, if necessary.

Another object of the present invention is to provide an improved RF door seal utilizing flexible metal sheets which can achieve square corners.

These and other objects and advantages of the present invention will become more apparent from the following detailed description of the preferred embodiment when taken in conjunction with the attached drawings.

BRIEF DESCRIPTION OF THE DRAWINGS

FIG. 6A is an expanded view of the arrangement of metal sheets in an alternative embodiment of the invention showing curved corner sheets.

FIG. 6B is an exploded view of FIG. 6A.

FIG. 7A is an expanded view of the arrangement of metal sheets in another alternative embodiment of the invention showing a "cut corner."

FIG. 7B is an exploded view of FIG. 7A.

DETAILED DESCRIPTION OF THE PREFERRED EMBODIMENT

Figure 1:
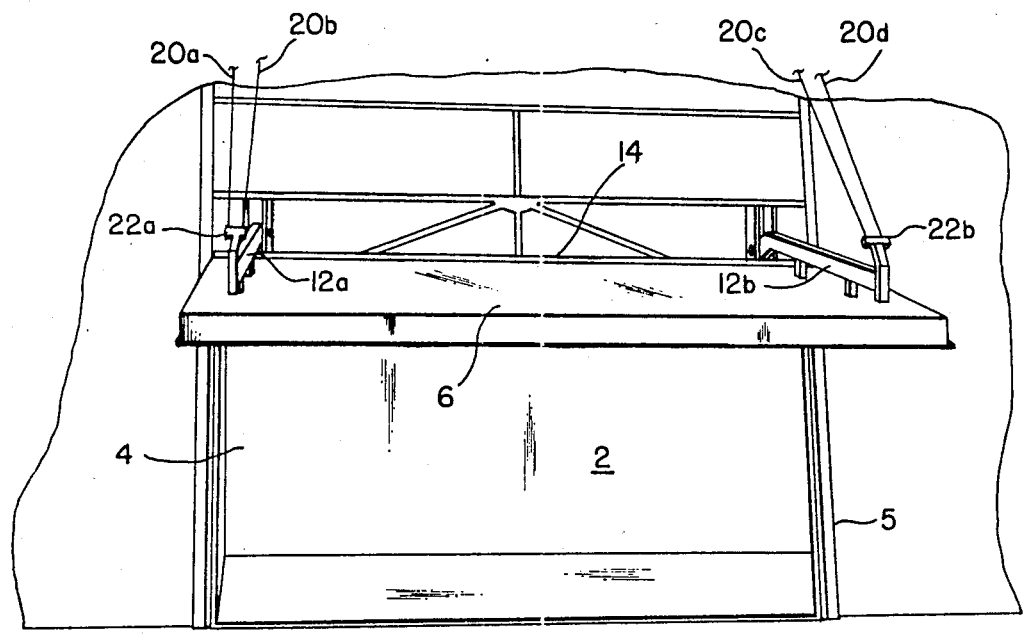
FIG. 1 is an isometric view of a radio frequency radiation containment showing a containment door partially open.
Figure 2:
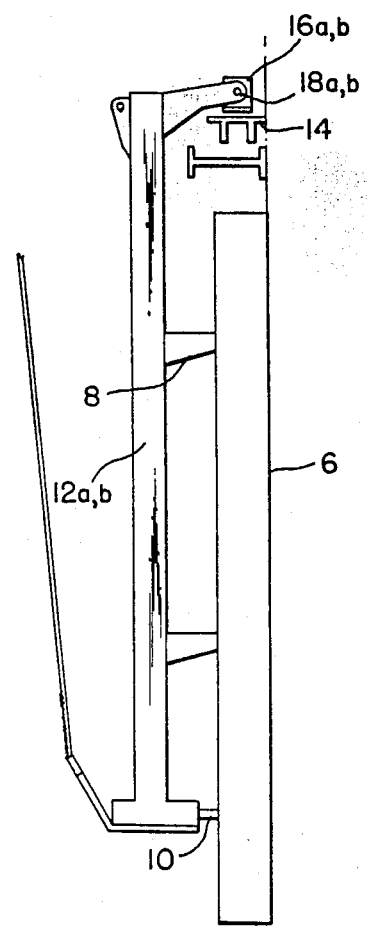
FIG. 2 is a side view of the containment door in a closed position.

Referring to FIG. 1, a chamber 2 containing a source of RF radiation is shown. Chamber 2 has an opening 4 allowing access of personnel and equipment to chamber 2 and a door frame 5. A door leaf 6 is shown which is used to seal the chamber 2. Referring to FIG. 2, the support means for the door leaf 6 is shown. The door leaf 6 is attached at points 8 and 10 to a pair of support beams 12a and 12b that are hinged to a header beam 14 of door frame 5 over the opening 4 of chamber 2 by a pair of brackets 16 and 16a. Door leaf 6 can therefore pivot about hinge points 18a and 18b through the center of brackets 16 and 16a, respectively.

Two wire ropes 20a and 20b are connected to one end 224a of support beam 12a. Similarly, two wire ropes 20c and 20d are connected to one end 22b of support beam 12b. The wire ropes 20a, b, c, and d are connected (not shown) to chamber 2 above the opening 4. The door leaf 6 may be raised or lowered by manipulating wire ropes 20a, b, c, and d. It should be noted that the door leaf 6 could also be opened by hydraulic cylinders (not shown) connected to the top end of the door and mounted to the door frame cross member (not shown). Pressurizing the hydraulic cylinders would open the door leaf 6 and lowering wire ropes 20a through d would close the door leaf 6 and add more control to the opening and closing procedure.

Figure 3:
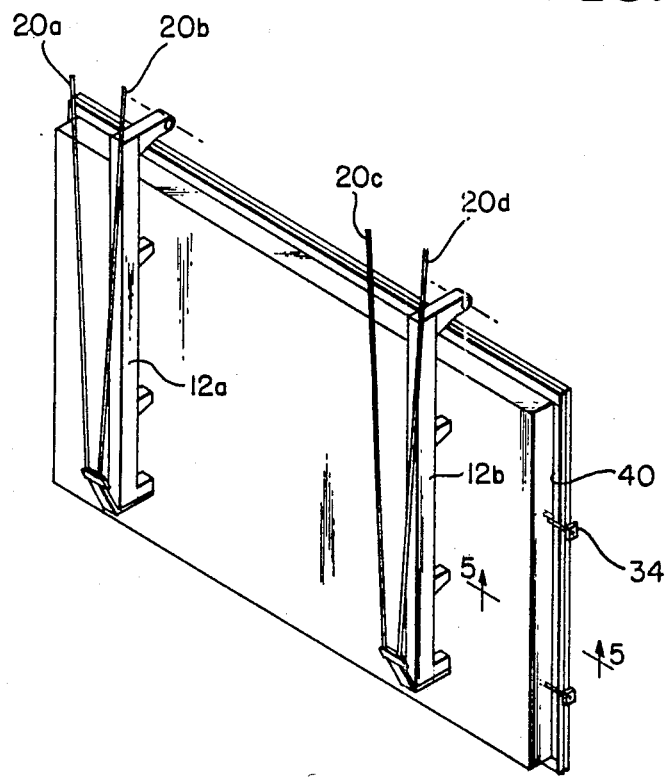
FIG. 3 is an isometric view of the door in a closed position.
Figure 4:
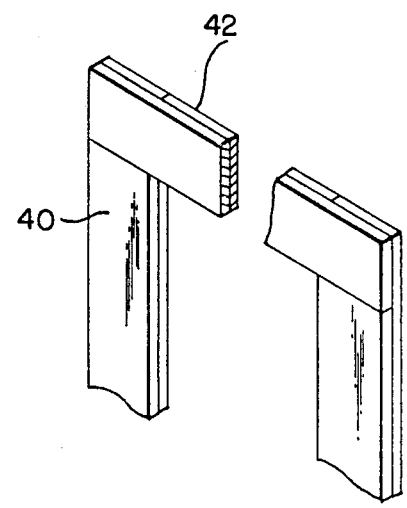
FIG. 4 is an expanded view of the arrangement of the layered metal sheets used as sealing means of the present invention showing two corners.

Referring now to FIGS. 3 through 5, the sealing means of the present invention will be described. Door frame 5 has a sealing or nesting surface 24 running inside of its border. Door leaf 6 has a layered coplanar seal, generally designated as 26 around its perimeter and attached to the door by bolts 28 as best shown in FIG. 5. A pin 30 extends from door leaf 6 at regular intervals and is received in hole 32 of receiving member 34. Receiving member 34 is attached to door frame 5. The pin 30 is attached to a piston 36 within door leaf 6 and can be extended through hole 32, thereby locking door leaf 6 in place or withdrawn when door 6 is to be opened. Coplanar seal 26 will be aligned with and rest against sealing surface 24 when the door leaf 6 is in its closed position. To insure a positive seal, means to hold the coplanar seal 26 against the sealing surface 24 such as an inflatable bladder seal 38 can be used. An inflatable seal is well known in the prior art and is described fully in U.S. Pat. No. 4,370,831 issued to Hamilton (see especially FIG. 7 of that patent).

FIG. 4 shows in detail the arrangement of the coplanar laminated seal 26. The seal 26 is comprised of a first series of flexible metal sheets 40 and a second series of flexible metal sheets 42. The metal sheets can be made of steel or another suitable metal. These series of sheets 40 and 42 will extend around the entire border of the door leaf 6. Each series can be composed of any number of individual sheets. Practically for a rectangular door opening four sheets in each of series 40 and 42 would seem best. The sheets of each series, in any case, are arranged so that series 40 sheets will cover the seams created by individual sheets of series 42. This feature will minimize the RF leakage through the seal 26 when compared to a single flexible metal sheet along the border of the door. A single sheet would require welding and hence local distortion of the metal at the welding seam resulting in RF leakage through the seal. The present invention contemplates no welding together of metal sheets, and since each layer of flexible metal sheets covers the seams of the other layer, RF leakage through this seal is minimized. The individual sheets of both series of sheets 40 and 42 may be flame sprayed to create a highly conductive and corrosion resistant seal. Flame spraying is a technique well known in the present art.

To effect RF shielding using the present invention the door leaf 6 is lowered into place. The coplanar seal 26 is aligned with the sealing surface 24 and the pins 30 are locked into holes 32. Inflatable seal 38 is activated and creates a pressure along the entire sealing surface 24 to insure good contact of coplanar seal 26 with sealing surface 24. It should be noted that the coplanar seal 26 of the present invention can be used regardless of the method of attaching the door leaf to the door frame or regardless of the means of opening or closing door leaf 6. It should be noted that more than 2 layers of flexible metal sheets could be used if desired as long as the seams of any two adjacent layers overlap as described above.

ALTERNATIVE EMBODIMENTS

Figure 5A:
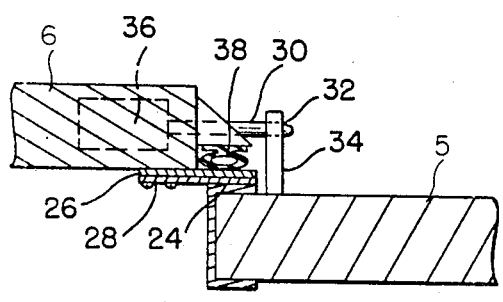
FIG. 5A is a cross sectional view taken along line 5—5 of FIG. 3.
Figure 5B:
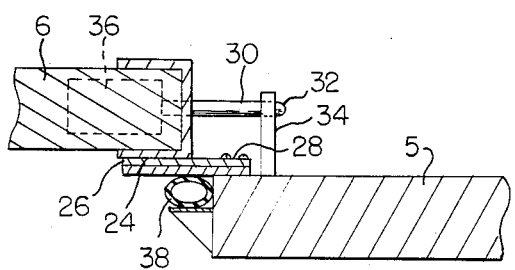
FIG. 5B is a cross sectional view taken along 5—5 of FIG. 3 showing an alternative arrangement of the coplanar seal and nesting surface.

The above invention has been described with the coplanar seal 26 being attached to the door leaf 6 (FIG. 2) and the seal aligning against sealing surface 24 as best shown in FIG. 5A. Alternatively, the layers of metal forming the coplanar seal 26 may be attached to the doorframe 5 and nest against a sealing surface on the door leaf 6. The other elements of the invention can remain the same as described above. In this embodiment, referring to FIG. 5B, seal 26 would be attached to door frame 5 by bolts 28 and sealing surface 24 would be part of the door leaf 6.

Alternative arrangements of the layers of metal sheets in addition to that described above may be used. The important factor, of course, is that the seams of one layer be covered by the sheets of the other layer. FIGS. 6A and 6B show an embodiment of the invention having rounded corner sheets 40a and 42a. The remainder of the first layer of sheets 40 and second layer of sheets 42 work with corner sheets 40a and 42a to overlap all seams. FIGS. 7A and 7B show yet another embodiment with "cut corners." In this embodiment, the corners of seal 26 do not form right angles, but meet as shown in FIG. 7A at angles Y1 and Y2 which are greater than ninety degress but less than one hundred and eighty degrees. Once again, all seams of one layer 40 are overlapped by seams of the other layer 42. It can also be noted that the sheets of one layer can meet such that the seam therebetween is at an angle greater than zero degrees and less than ninety degress to the horizontal. An example of this embodiment (not shown) would be when adjacent sheets meeting at the corner of the door leaf and door frame form a seam having a forty-five degree angle with the horizontal.

The invention may be embodied in other forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is as follows:

1. A door leaf and frame assembly for a room that is shielded against leakage of electromagnetic radiation when the door leaf is in its closed position comprising:
   a. a rectangular door leaf having four corners;
   b. a door frame on which said door leaf is mounted, the door frame on one side of the door leaf and defining a rectangular passage opening; the door frame opposing and spaced outwardly from the borders of said door leaf all the way around the passage opening;
   c. a first series of flexible cantilevered metal sheets comprised of individual flexible metal sheets arranged end to end and forming seams therebetween, the first series of metal sheets located between said door leaf and said door frame all the way around said door leaf and said door frame, when said door leaf is closed, the first series of flexible metal sheets having at least one curved portion in a corner of said door leaf and said door frame;
   d. a second series of flexible cantilevered coplanar metal sheets, the second series of flexible metal sheets adjacent to said first series of flexible metal sheets and located between said door leaf and said door frame, and so arranged end to end as to overlap the seams made by said first series of flexible metal sheets to minimize electromagnetic leakage through said door leaf and said door frame when said door leaf is closed; and
   e. holding means to hold said first and said second series of flexible metal sheets in contact with said door leaf and said door frame when said door leaf is closed.

2. A door leaf and frame assembly for a room that is shielded against leakage of electromagnetic radiation when the door leaf is in its closed position comprising:
   a. a rectangular door leaf having four corners;
   b. a door frame on which said door leaf is mounted, the door frame on one side of the door leaf and defining a rectangular passage opening; the door frame opposing and spaced outwardly from the borders of said door leaf all the way around the passage opening;
   c. a first series of flexible cantilevered metal sheets comprised of individual flexible metal sheets arranged end to end and forming seams therebetween, the first series of metal sheets located between said door leaf and said door frame all the way around said door leaf and said door frame when said door leaf is closed, the first series of flexible metal sheets having at least one sheet in a corner of said door leaf and said door frame aligned at an angle greater than 90 degrees and less than 180 degrees to adjacent sheets in said first series of metal sheets;
   d. a second series of flexible cantilevered coplanar metal sheets, the second series of flexible metal sheets adjacent to said first series of flexible metal sheets and located between said door leaf and said door frame, and so arranged end to end as to overlap the seams made by said first series of flexible metal sheets to minimize electromagnetic leakage through said door leaf and said door frame when said door leaf is closed; and
   e. holding means to hold said first and second series of flexible metal sheets in contact with said door leaf and said door frame when said door leaf is closed.

3. A door leaf and frame assembly for a room that is shielded against leakage of electromagnetic radiation when the door leaf is in its closed position comprising:
   a. a rectangular door leaf, the door leaf having a sealing surface portion at the outer borders of said door leaf;
   b. a door frame on which said door leaf is mounted, the door frame on one side of the door leaf and defining a rectangular passage opening, the door frame opposing the outer borders of said door leaf all the way around the passage opening;
   c. a first series of rectangular cantilevered flexible metal sheets comprised of at least four coplanar individual metal sheets, the first series of metal sheets located at the borders of said door frame all the way around said door frame with a vertically aligned sheet adjacent to a horizontally aligned sheet and forming a seam therebetween in each of the four corners of the border of said door frame, the first series of flexible metal sheets closest to said door leaf and capable of aligning with the sealing surface portion of said door leaf when said door leaf is closed;
   d. a second series of at least four rectangular cantilevered coplanar flexible metal sheets, the second series of flexible metal sheets shaped as said first series of flexible metal sheets, the second series of flexible metal sheets adjacent to said first series of flexible metal sheets and so arranged as to overlap the seams made by said first series of flexible metal sheets, including any horizontal seams of said first series of flexible metal sheets being overlapped by vertical metal sheets of said second series of flexible metal sheets at the corners of said door frame and said door leaf, and any vertical seams of said first series of flexible metal sheets being overlapped by horizontal sheets of said second series of flexible metal sheets at the corners of said door frame and said door leaf to minimize electromagnetic leakage through said door leaf and said door frame when said door leaf is closed; and e. holding means to hold said series of flexible metal sheets in contact with the sealing surface portion of said door leaf when said door leaf is closed.

4. A door leaf and frame assembly for a room that is shielded against leakage of electromagnetic radiation when the door leaf is in its closed position comprising:
   a. a rectangular leaf;
   b. a door frame on which said door leaf is mounted, the door frame on one side of the door leaf and defining a rectangular passage opening; the door frame opposing and spaced outwardly from the borders of said door leaf all the way around the passage opening;
   c. a first series of flexible cantilevered metal sheets consisting of individual flexible metal sheets arranged end to end and forming seams therebetween, at least one seam making an angle with the horizontal of greater than zero degrees and less than ninety degrees, the first series of metal sheets located between said door leaf and said door frame all the way around said door leaf and said door frame when said door leaf is closed;
   d. a second series of flexible cantilevered coplanar metal sheets, the second series of flexible metal sheets adjacent to said first series of flexible metal sheets and located between said door leaf and said door frame, and so arranged end to end as to overlap the seams made by said first series of flexible metal sheets to minimize electromegnetic leakage through said door leaf and said door frame when said door leaf is closed; and
   e. holding means to hold said first series and second series of flexible metal sheets in contact with said door leaf and said door frame when said door leaf is closed.

* * * * *